United States Patent

Fontana et al.

[11] Patent Number: 5,708,604
[45] Date of Patent: Jan. 13, 1998

[54] DYNAMIC SELECTION CONTROL IN A MEMORY

[75] Inventors: Marco Fontana, Milan; Luigi Pascucci, Sesto S. Giovanni, both of Italy

[73] Assignee: SGS-Thomson Microelectronics S.r.l., Agrate Brianza, Italy

[21] Appl. No.: 789,616

[22] Filed: Jan. 27, 1997

[30] Foreign Application Priority Data

Feb. 5, 1996 [IT] Italy .................................. 96830047.5

[51] Int. Cl.$^6$ ............................................. G11C 16/06
[52] U.S. Cl. ................................ 365/185.23; 365/233.5; 365/189.11; 365/203; 365/204
[58] Field of Search ........................... 365/185.23, 189.11, 365/203, 204, 233.5

[56] References Cited

U.S. PATENT DOCUMENTS 5,631,865  5/1997  Iwase et al. .................. 365/189.11

FOREIGN PATENT DOCUMENTS 0 559 995 A1  9/1993  European Pat. Off. .
0 662 690 A1  12/1993  European Pat. Off. .

OTHER PUBLICATIONS

Motomu Ukita et al., IEEE International Solid State Circuits Conference, vol. 36, Feb. 1993, p. 252–253, XP000388097, "A Single Bitline Cross–Point Cell Activation (SCPA) Architecture for Ultra Low Power SRAMs".

Primary Examiner—Joseph E. Clawson, Jr.
Attorney, Agent, or Firm—Allen, Dyer, Doppelt, Milbrath & Gilchrist, P.A.

[57] ABSTRACT

A driving circuit for a final decoding stage of an EPROM, EEPROM or FLASH EPROM for battery powered apparatuses functioning at relatively low supply voltage avoids energy absorption from a commonly boosted voltage node by switching the capacitance of the control node of the p-channel pull-up device of the CMOS inverter that drives the memory line and which constitutes the load of the driving circuit. The node is effectively charged by drawing current from the supply node and is discharged rapidly by switching in parallel thereto a previously discharged capacitance. This charge-sharing switcheable capacitance may advantageously be the capacitance of a similar p-channel pull-up control node of a deselected wordline of the array.

10 Claims, 2 Drawing Sheets

DYNAMIC SELECTION CONTROL IN A MEMORY

FIELD OF THE INVENTION

The present invention relates to a driving circuit of a final decoding stage of a row of memory cells of a memory matrix. Although reference is made to the decoding of a (selection) of a row of a memory matrix, the considerations and the device of the invention can be equally considered as referring to the decoding (selection) of a column of the same matrix.

BACKGROUND OF THE INVENTION

The decoding circuitry for a row or column of memory cells of a memory matrix allows access, during a reading or writing phase, of the cell identified by a certain address fed to the relative inputs of the memory. During a reading phase a selected cell corresponds to each bit of the output data (word). Commonly, in conjunction with the row selection a row of cells is switched on, that is, biased, whereas, upon column decoding, it is selected which output line (column) is coupled to a sensing node bit line of the bit value.

In high integration state of the art EPROM, FLASH-EPROM, ROM or DRAM memories and so forth, in which each elementary cell occupies an area of a few square micrometers, the decoding circuitry represents a critical item of the design, because it must satisfy more and more stringent requisites of compactness, speed and low power consumption. The latter requisite is particularly important in the case of reprogrammable memories (EPROM, EEPROM and FLASH-EPROM) functioning at a relatively low voltage (3 V), where the final decoding stages are powered through voltage boost circuits integrated in the device. In these memory devices is widely used a circuit architecture based on the exclusive use of n-channel transistors. A typical scheme of a decoding circuit is shown by way of an example in FIG. 1.

The Irow signal must ensure a correct performance of the CMOS buffer of the selected row (WORDLINE or simply WL). During a reading phase, the selected WL is typically biased at a boosted voltage, generated internally to the device, by a dedicated charge pump circuit. During a writing phase, the selected WL is biased at a programming voltage (VPP), which is also generated internally. In both cases, such an Irow signal is responsible for a static consumption from the VPC line (that is from the line or node purposely generated boosted voltage for the different operating phases of the memory) upon the selection of a certain row or column, of course besides determining the driving speed of the WL buffer during switchings.

There are many known approaches for realizing these driving circuits. In particular, an interesting and effective driving circuit of the pull-up device of a final decoding stage, that is for row or column selection, is described in the European Patent Application No. 93830489.6, filed on Dec. 2, 1993 and published as EP-0 662 690-A1, on Jul. 12, 1995, of the present assignee.

The circuit described in this prior publication realizes a dynamic control of the Irow signal such as to fully switch on the pull-up device, and obtain a quick increment of the pull-up current during the active phase. The active phase is when a selection or deselection command takes place, and a slow drop toward a minimum current level through the pull-up device which is brought in a weakly switch-on condition (such to avoid that the input node of the row buffer becomes floating) during a stand-by phase, between successive switchings occurring in the address circuitry of the memory.

Despite the evident advantages of the solution described in the above cited patent if compared with the previous technique for the reasons therein highlighted, the driving stage has the drawback of absorbing current (energy) from the VPC line for charging the contact line.

SUMMARY OF THE INVENTION

A first aim of the present invention is that of eliminating this type of consumption.

This result is attained by ensuring that the driving stage of the control line absorbs the necessary energy to charge the capacitance of the line itself from the external power supply, rather than from the node of the boosted voltage generated by the internal charge pump. According to a further aspect of the circuit of the invention, in the case of a memory array divided into sectors, and wherein the row or column to be decoded is divided into at least two individually selectable portions, the need to integrate a capacitance, usually of a relatively high value, is eliminated for distributing the electric charge present on the control node of the pull-up device at the instant of selection so to accelerate a quick drop of the voltage. This is obtained, in a multimatrix memory by exploiting the capacitance of the control node of the pull-up device of the decoding stage relative to the deselected row or column.

BRIEF DESCRIPTION OF THE DRAWINGS

The various aspects and advantages of the invention will become clearer through the following description of some important embodiments and by referring to the attached drawings, wherein.

DETAILED DESCRIPTION OF PREFERRED EMBODIMENTS

Figure 1:
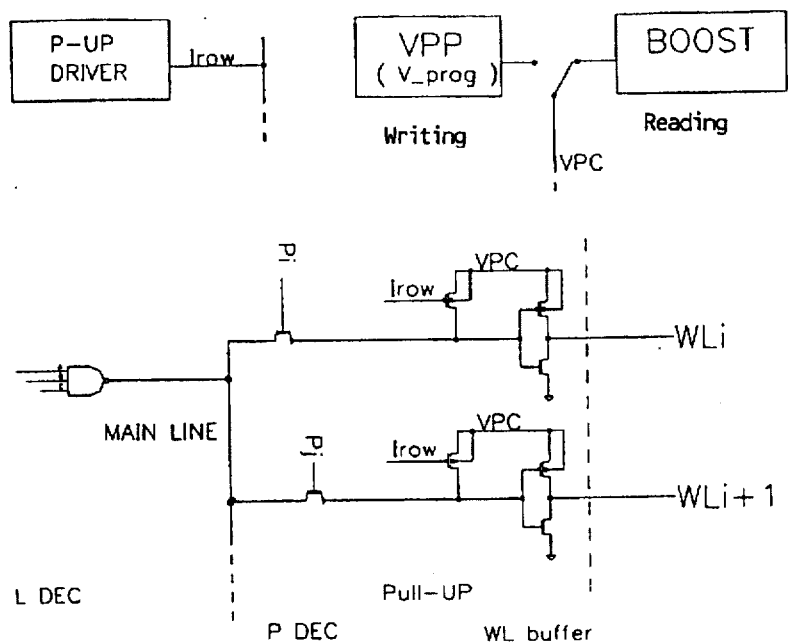
FIG. 1 shows, as mentioned above, a partial sample scheme of a final decoding stage of rows of memory matrix cells as in the prior art.

The schematic diagram of FIG. 1 shows a typical architecture of final decoding stages for a plurality of word lines Wli, Wli+1, . . . . . The NAND circuit decodes the address of the line that must be selected, represented by the signals A, B and C. The selection of a particular line (Wli, Wli+1, . . . . ), managed through the relative primary MAIN LINE, is performed by the switches driven by the respective selection signals Pi, Pj . . . . The word line WL is connected to the output of the CMOS inverter which represents the decoding or selection final stage.

The supply voltage of the line driving the CMOS inverter takes different values during the different operating phases of the memory, and this voltage is generally referred to as VPC. As schematically indicated in FIG. 1, the VPC voltage can be generated during a reading phase, by a dedicated internal charge pump circuit BOOST. To ensure, under all working conditions, the correct functioning of the line driving the CMOS inverter, its input node must be correctly biased. For this purpose, a pull-up device (typically a p-channel transistor) controlled by the Irow signal is employed. The signal is unique for all the matrix lines and, as shown, is generated by the P-UP DRIVER block. The latter circuit is the object of the present invention.

Figure 2:
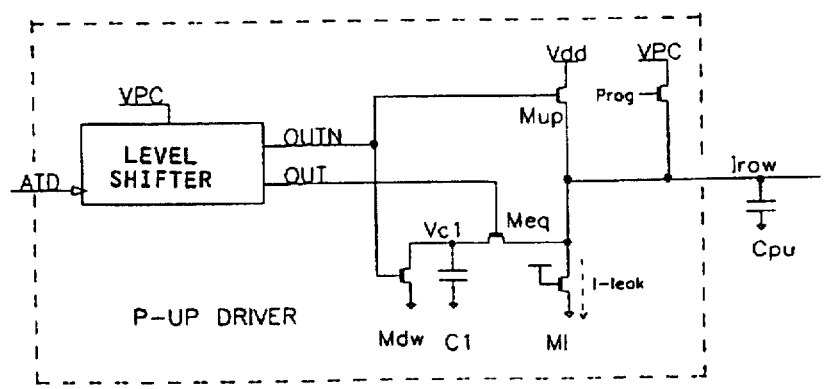
FIG. 2 shows a driving circuit realized according to the present invention.

FIG. 2 shows a preferred embodiment of the driving circuit of the pull-up device of the invention. Cpu is the capacitance of the control node of the pull-up device (p-channel), which represents is the load of the driving circuit, charged and discharge from the driving circuit. The driving circuit, like known circuits, comprises a level shifting circuit capable of outputting a pair of control complementary signals OUTN and OUT of an amplitude equal or similar to the VPC voltage. The switching of the signals OUT and OUTN is caused by the occurrence of an ATD impulse (or of a signal derived) produced by a switching in the address circuits of the memory.

Figure 3:
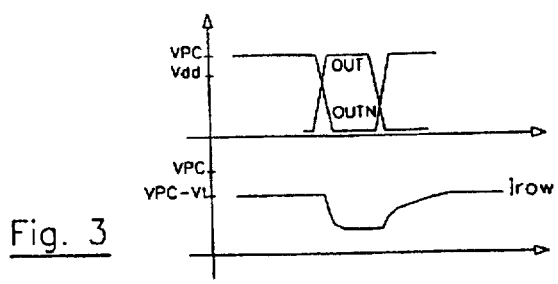
FIG. 3 shows the form of the signals of the driving circuit of the invention.

A switching of the pair of control signals OUTN and OUT, caused by an ATD impulse received as input from the level shifting block, is graphically depicted in the upper part of the diagram of FIG. 3, which refers to a phase of the memory operation in which the VPC voltage is a boosted voltage as compared to the supply voltage Vdd. During a stand-by phase, the signal OUTN is high (at the VPC voltage) while the signal OUT is low (practically at ground potential). In this condition the n-channel transistor Mdw is conducting, thus discharging the capacitance C1 to ground. The n-channel transistor Meq is not conducting, thus isolating the capacitance C1 from the output node Irow.

The n-channel transistor Mup keeps the output node Irow to a high level given by the difference between the VPC voltage, applied to the transistor's gate, and its threshold voltage Vt. To prevent sub-threshold currents of Mpu from increasing the voltage of the Irow line, a weak current, I-leak, is carried by the MI transistor, drawing it from the VPC line. At the switching instant (selection) the voltage of the output node Irow must drop as quick as possible to produce an efficient pull-up action by the dedicated p-channel transistor on the input node of the decoding final CMOS inverter which drives the selected memory line. This is attained by the closing (switch on) of the switch constituted by the Meq transistor and by the simultaneous switching off of the Mdw transistor. This causes an abrupt voltage drop of the Irow node according to an exponential (RC) law, due to a charge redistribution on the capacitance C1 that is switched in parallel to the capacitance Cpu of the output node Irow.

Such a sudden drop of the voltage on the row node is graphically depicted in the bottom diagram of FIG. 3 by the voltage drop, according to a substantially exponential law (RC), on the Irow node, from the high VPC-Vt value to a lower value which is determined by the following expression:

$$(VPC-Vt)*Cpu/(Cpu+1)$$

The voltage Vt is the threshold voltage of the n-channel transistor Mup.

The other current terminal of the Mup transistor is connected to the Vdd supply, so that the current that charges the output node Irow is drawn from the supply line Vdd, without causing a corresponding dynamic current consumption from the boosted line VPC. In relative terms, the elimination of this current absorption has great relevance because the load capacitance Cpu of the control node of the pull-up device is much larger than the internal capacitances of the driving circuit as a whole.

As easily noticed from FIGS. 2 and 3, the high level of the output Irow node is unaltered and given by VPC-Vt as long as the inequality Vdd>VPC-Vt is met. Contrarily, the high level would coincide with the voltage Vdd. It may also be noticed that in the majority of applications the level of the VPC voltage that is commonly required satisfies the above inequation.

During the deselection phase, when the pair of control signals OUTN and OUT return to a stand-by condition, the Meq switch opens, isolating the charge sharing capacitance C1 from the Irow node. The discharge transistor Mdw switches on thus discharging toward the ground node, the electric charge accumulated in C1, while the n-channel transistor Mup enters into a saturated diode-operating state, starting to charge again the capacitance Cpu by drawing current from the Vdd node up to the point of bringing the voltage of the output Irow node back to its maximum value (VPC-Vt) through a relatively slow voltage ramp. A slow up ramp of the Irow voltage helps in "expanding" in time the selection phase, making decoding safer by preventing the case in which, through a wrong estimate of the delays, the Irow signal be already returned to its high value while the address lines (A, B, C, P) are not yet completely stable.

In the scheme of FIG. 2, is also indicated the programming transistor driven by the signal Prog, normally present for biasing at the programming voltage (VPC) the Irow output node of the driving circuit of pull-up during a programming phase of the memory, according to a normal circuit architecture. In substance, this branch or section of the circuit of the P-UP DRIVER block does not directly pertain to the object of the present invention that involves the driving circuit of the pull-up device, during a reading phase of the memory.

Figure 4:
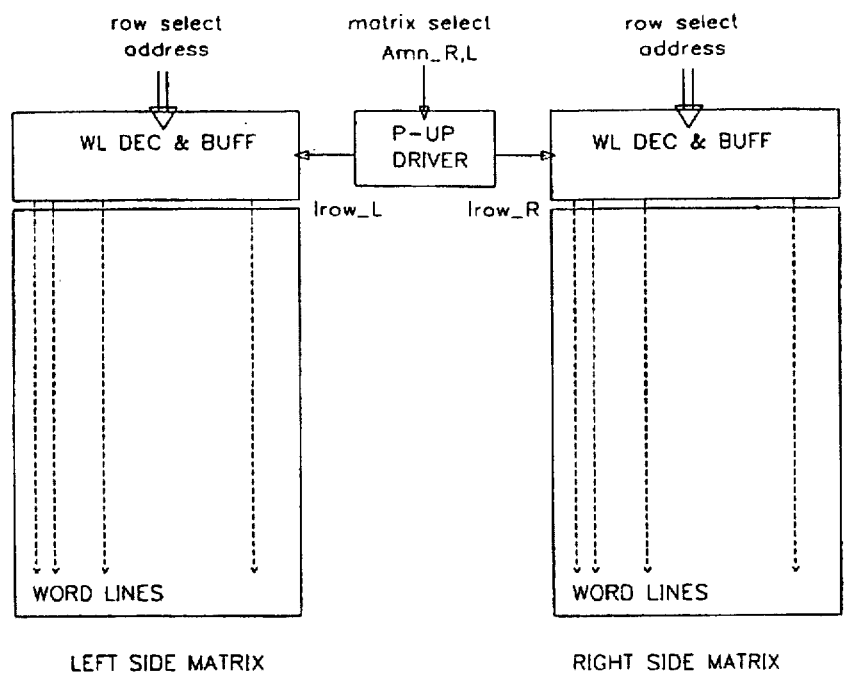
FIG. 4 is a blocks diagram showing an application of the driving circuit of the invention in the specific case of a memory architecture in which the matrix is divided in a left and right section.

The driving circuit of the invention is even more advantageous in multimatrix memory devices, in which only one matrix at the time is selected during a reading phase. The architecture of this type of memory is schematized in FIG. 4. As easily recognizable, the architecture is based on a so-called hierarchical decoding scheme. The WL_DEC&BUF blocks represent a plurality of driving buffers of the respective lines (wordlines) of the left side sector LEFT SIDE MATRIX, and of the right side sector RIGHT SIDE MATRIX of the memory, to which the line address codes arrive.

The driving lines of the buffer pull-ups are two Irow_R and Irow_L, respectively. The Irow signal pertaining to the portion of the matrix that, for a certain time interval, is deselected can take any voltage value capable of ensuring the conduction of the pull-ups driven by it. The Irow signal relative to the selected portion behaves, as hereinbelow described, similarly to the case, already considered of an undivided matrix.

Figure 5:
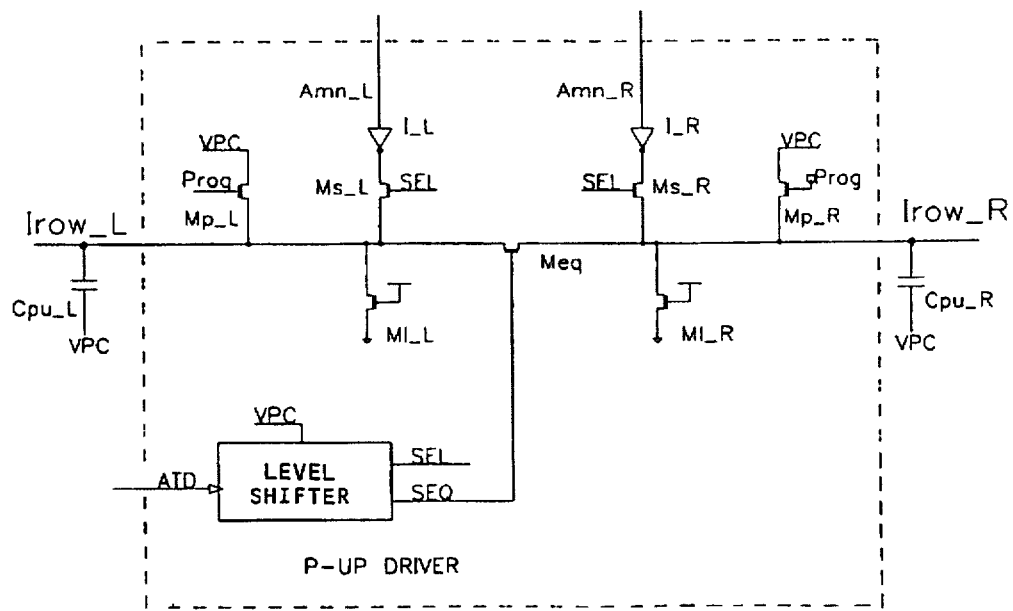
FIG. 5 is a partial circuit diagram which illustrates the application of the driving circuit of the present invention in the case of a matrix architecture like the one depicted in FIG. 4.

As shown in FIG. 5, in this type of application, the driving circuit of the invention can be realized according to an alternative embodiment that avoids the need to integrate a charge sharing capacitance C1. The function of the charge sharing or charge redistribution capacitance is effectively performed by switching to the output node of the driving circuit relative to the selected portion of the memory, that is to the Irow_R output or to the Irow_L output, the other, deselected, output node, through the n-channel transistor Meq, which in this case is controlled by the signal SEQ of the pair of signals produced by the level-shifting block, similar to the scheme already described with reference to FIG. 2. The other control signal, herein identified SEL, controls the n-channel transistors Ms_R and Ms_L in phase with each other. The function of this pair of n-channel transistors Ms_L and Ms_R is similar to that of the pair of transistors Mup and Mdw of the scheme described in FIG. 2, obviously by alternating themselves in those two roles, depending on whether the right side or the left side of the memory is selected.

Figure 6:
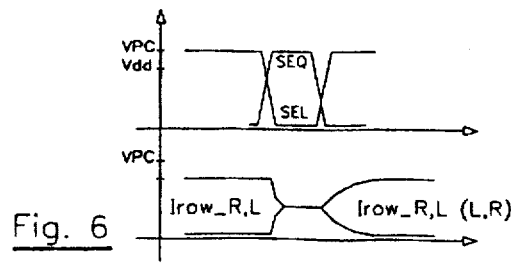
FIG. 6 shows the form of the signals of the circuit of FIGS. 4 and 5.

Assuming that, through the command Amn_L, the left side of the memory is selected, then through the CMOS inverter $I_L$, the transistor Ms_L absorbs current from the supply rail through the pull-up branch of the Amn_L line inverter $I_L$ in order to charge the Irow_L node, thus performing the function of the transistor Mup of the scheme of FIG. 2. At the same time, the transistor Ms_R provides a discharge path of the capacitance represented by the node Irow_R pertaining to the deselected side of the memory through the pull-down branch of the CMOS inverter $I_R$, controlled by the Amn_R line, basically acting as the discharging transistor Mdw of the capacitance C1 of the scheme of FIG. 2. At the instant of switching, determined by an ATD impulse, from its high value of stand-by (VPC) the control signal SEL goes to a low value (ground potential) while the control signal SEQ takes a high value (VPC), switching on the switch Meq, so as to link the discharged Irow_R node to the charged Irow_L node. Due to redistribution of the electric charge of the Cpu_L capacitance over the two nodes, an abrupt voltage drop of the charged node Irow_L is obtained and a consequent rise of the voltage on the discharged node Irow_R, as shown in the upper diagram of FIG. 6. At the same time, the transistors Ms_L and Ms_R are cut off. The control signals SEL and SEQ switch again at the end of the ATD pulse, as shown in the upper diagram of FIG. 6.

The transistor Meq again isolates the two nodes Irow_L and Irow_R, the transistors Ms_L and Ms_R start to conduct again under a deeper and deeper saturation condition, the first recharging the node Irow_L and the second discharging the node Irow_R, which return relatively slowly to their initial state. This is shown in the bottom diagram of FIG. 6. Of course, by inverting this memory side selection command, that is by switching the signals Amn_L and Amn_R, the same functional scheme is obtained, but with inverted roles.

FIG. 5 shows, as for the case of a single matrix, the programming transistors as well as the leak devices towards ground, M1_L and M1_R, that define the threshold of the transistors threshold Ms_L and Ms_R, by establishing a small leakage current towards ground of a value predefinible at the design stage. As can be observed, the driving circuit of the invention according to the alternative embodiment of FIG. 5, improves the compactness of the memory because of the exchange of roles between the two transistors Ms_L and Ms_R. In addition, the circuit eliminates the requisite of integrating an additional capacitance of adequate size.

We claim:

1. A driving circuit for a pull-up device for an input node of a final selection stage of a memory line capable of producing a relatively fast increment of pull-up current during a selection phase and a relatively fast decrement of pull-up current during a deselection phase, said driving circuit comprising:

a charge pump circuit for generating a first voltage;

level shifting means supplied with the first voltage generated internally by said charge pump circuit and driven by an impulse produced by a switching in address circuitry of the memory and capable of generating a pair of complementary control signals of an amplitude similar to that of said first voltage; and means driven by the pair of complementary control signals and comprising at least one charge redistribution capacitance switchable to a driving node of the pull-up device for causing a fast voltage drop on the driving node during a selection phase and a slow increment of voltage on said driving node during a deselection phase, said means comprising a first charge transistor functionally connected between a supply rail and the driving node of the pull-up device;

a second discharge transistor functionally connected between said capacitance and the ground node, driven in phase with said first charge transistor by a first signal of said pair of complementary control signals; and a switch, driven by the other of said pair of complementary control signals, capable of coupling the capacitance to the driving node.

2. A driving circuit as defined in claim 1, wherein all of said first and second transistors and said switch are n-channel devices.

3. A driving circuit according to claim 2, further comprising a leakage element connected between the driving node of the pull-up device and ground capable of ensuring a leakage current towards ground of a pre-established value.

4. A driving circuit according to claim 1, for a memory array divided in two individually selectable sections; and wherein said charge redistribution capacitance is provided by capacitance of a driving node of the deselected section of the memory array.

5. A driving circuit according to claim 4, further comprising a first CMOS inverter having an output for selecting a first memory section, and a second CMOS inverter having an output for selecting a second memory section; wherein one of said first and second transistors driven in phase by said first control signal is coupled to the output of said first CMOS inverter for selecting the first memory section; wherein the other of said first and second transistors is coupled to the output of said second CMOS inverter for selecting the second memory section; wherein said first and second CMOS inverters define a pull-up branch providing for a charge path from the supply rail; and wherein said first and second CMOS inverters define a pull-down branch providing for a discharge path towards ground.

6. A driving circuit for a pull-up device for an input node of a final selection stage of a memory line capable of producing a relatively fast increment of pull-up current during a selection phase and a relatively fast decrement of pull-up current during a deselection phase, said driving circuit comprising:

level shifting means supplied with the first internally generated voltage and driven by an impulse produced by a switching in address circuitry of the memory and capable of generating a pair of complementary control signals of an amplitude similar to that of said first voltage; and means driven by the pair of complementary control signals and comprising at least one charge redistribution capacitance switchable to a driving node of the pull-up device for causing a fast voltage drop on the driving node during a selection phase and a slow increment of voltage on said driving node during a deselection phase, said means comprising a first n-channel charge transistor functionally connected between a supply rail and the driving node of the pull-up device;

a second n-channel discharge transistor functionally connected between said capacitance and the ground node, driven in phase with said first charge transistor by a first signal of said pair of complementary control signals; and a switch, driven by the other of said pair of complementary control signals, capable of coupling the capacitance to the driving node.

7. A driving circuit as defined in claim 6, wherein said switch comprises an n-channel device.

8. A driving circuit according to claim 7, further comprising a leakage element connected between the driving node of the pull-up device and ground capable of ensuring a leakage current towards ground of a pre-established value.

9. A driving circuit according to claim 6, for a memory array divided in two individually selectable sections; and wherein said charge redistribution capacitance is provided by capacitance of a driving node of the deselected section of the memory array.

10. A driving circuit according to claim 9, further comprising a first CMOS inverter having an output for selecting a first memory section, and a second CMOS inverter having an output for selecting a second memory section; wherein one of said first and second transistors driven in phase by said first control signal is coupled to the output of said first CMOS inverter for selecting the first memory section; wherein the other of said first and second transistors is coupled to the output of said second CMOS inverter for selecting the second memory section; wherein said first and second CMOS inverters define a pull-up branch providing for a charge path from the supply rail; and wherein said first and second CMOS inverters define a pull-down branch providing for a discharge path towards ground.

* * * * *